United States Patent
Jost et al.

(10) Patent No.: US 6,982,228 B2
(45) Date of Patent: Jan. 3, 2006

(54) METHODS OF ETCHING A CONTACT OPENING OVER A NODE LOCATION ON A SEMICONDUCTOR SUBSTRATE

(75) Inventors: Mark E. Jost, Boise, ID (US); Chris W. Hill, Boise, ID (US)

(73) Assignee: Micron Technology, Inc., Boise, ID (US)

(*) Notice: Subject to any disclaimer, the term of this patent is extended or adjusted under 35 U.S.C. 154(b) by 123 days.

(21) Appl. No.: 10/278,530

(22) Filed: Oct. 22, 2002

(65) Prior Publication Data

US 2003/0045111 A1 Mar. 6, 2003

Related U.S. Application Data

(62) Division of application No. 09/797,898, filed on Mar. 1, 2001, now Pat. No. 6,596,641.

(51) Int. Cl.
*H01L 21/302* (2006.01)

(52) U.S. Cl. ............ 438/738; 438/737; 438/735; 438/706

(58) Field of Classification Search ............ 438/704, 438/706, 714, 733, 743, 735, 737, 738
See application file for complete search history.

(56) References Cited

U.S. PATENT DOCUMENTS

| | | | |
|---|---|---|---|
| 5,849,635 A | 12/1998 | Akram et al. ............ 438/704 |
| 5,869,403 A | 2/1999 | Becker et al. ............ 438/738 |
| 5,933,723 A | 8/1999 | Schuegraf et al. ......... 438/238 |
| 5,994,237 A | 11/1999 | Becker et al. ............ 438/734 |
| 6,083,321 A | 7/2000 | Lei et al. |
| 6,096,133 A | 8/2000 | Yuuki et al. |
| 6,110,753 A * | 8/2000 | Nakamura .................. 438/16 |
| 6,215,187 B1 * | 4/2001 | Ooto et al. ................ 257/758 |
| 6,548,853 B1 * | 4/2003 | Hwang et al. ............ 257/306 |
| 2003/0186526 A * | 10/2000 | Chang et al. ............ 436/600 |
| 2002/0015855 A1 | 2/2002 | Sajoto et al. |
| 2002/0026965 A1 * | 3/2002 | Michaluk et al. ......... 148/422 |
| 2002/0055270 A1 | 5/2002 | Narwankar et al. |

\* cited by examiner

*Primary Examiner*—Richard Elms
*Assistant Examiner*—Brad Smith
(74) *Attorney, Agent, or Firm*—Wells St. John P.S.

(57) ABSTRACT

A chemical vapor deposition method includes providing a semiconductor substrate within a chemical vapor deposition chamber. At least one liquid deposition precursor is vaporized with a vaporizer to form a flowing vaporized precursor stream. The flowing vaporized precursor stream is initially bypassed from entering the chamber for a first period of time while the substrate is in the deposition chamber. After the first period of time, the flowing vaporized precursor stream is directed to flow into the chamber with the substrate therein under conditions effective to chemical vapor deposit a layer over the substrate. A method of etching a contact opening over a node location on a semiconductor substrate is disclosed.

32 Claims, 5 Drawing Sheets

METHODS OF ETCHING A CONTACT OPENING OVER A NODE LOCATION ON A SEMICONDUCTOR SUBSTRATE

This application is a divisional of U.S. patent application Ser. No. 09/797,898, which was filed on Mar. 1, 2001 and which is now U.S. Pat. No. 6,596,641, and which is incorporated by reference herein.

TECHNICAL FIELD

This invention relates to chemical vapor deposition methods and to methods of etching a contact opening over a node location on a semiconductor substrate.

BACKGROUND OF THE INVENTION

The invention primarily grew out needs for making highly reliable, high density dynamic random access memory (DRAM) contacts, although the invention is in no way so limited. Advanced semiconductor fabrication is employing increasing vertical circuit integration as designers continue to strive for circuit density maximization. Such typically includes multi-level metalization and interconnect schemes.

Electrical interconnect techniques typically require electrical connection between metals or other conductive layers, or regions, which are present at different elevations within the substrate. Such interconnecting is typically conducted, in part, by etching a contact opening through insulating material to the lower elevation of a desired node contact, for example of a conductive layer or conductive region. The significant increase in density of memory cells and vertical integration places very stringent requirements for contact fabrication technology. The increase in circuit density has resulted in narrower and deeper electrical contact openings between layers within the substrate, something commonly referred to as increasing aspect ratio, which is the ratio of maximum opening height to minimum opening width. Increasing aspect ratios make it difficult to complete etches to desired node locations.

For example, one typical contact etch includes the etch to a substrate diffusion region formed within a semiconductive material which is received between a pair of field effect transistor gate lines. The gate lines are typically encapsulated in a silicon nitride and/or undoped silicon dioxide material. A planarized layer of borophosphosilicate glass (BPSG) is typically provided over the field effect transistors and through which a contact opening to the substrate will be etched. Further, a very thin undoped silicon dioxide layer is typically provided intermediate the BPSG layer and the underlying substrate material to shield from diffusion of the boron and phosphorus dopants from the BPSG layer into underlying substrate material. Additionally or alternately, a thin silicon nitride layer might also be provided. An antireflective layer might also be provided over the BPSG. The layers are typically masked, for example with photoresist, and a contact opening is formed through the mask over the underlying layers over the diffusion region to which contact is desired. The antireflective coating is then etched, followed by an etch conducted through the BPSG which is substantially selective to the silicon nitride layer, undoped oxide and underlying silicon substrate such that the etch is typically referred to as a substantially self-aligned contact etch. An example dry anisotropic etching chemistry for the etch includes a combination of $CHF_3$, $CF_4$, $CH_2F_2$ and Ar. The typical intervening undoped silicon dioxide layer between the underlying substrate and the BPSG will typically also be etched through in spite of a poor etch rate compared to BPSG, principally due to the extreme thinness of this layer. Further, if silicon nitride is used in addition or in place of the undoped silicon dioxide layer, it would typically be separately etched. At the conclusion of the etch or etches, a native oxide might grow, which could be stripped with a dilute HF solution prior to plugging the contact opening with conductive material(s).

When the aspect ratio of the contact opening being etched through the BPSG was sufficiently below 4:1, a single etch chemistry for the BPSG was typically suitable to clear the BPSG and a thin undoped silicon oxide layer all the way to the diffusion region to outwardly expose the same, assuming silicon nitride was not present. However, as the aspect ratio of the contact opening through the BPSG approached and exceeded 4:1, it was discovered in some instances that the subject chemistry, and other attempted chemistries, were not sufficient to enable clearing the doped oxide dielectric material utilizing a single chemistry and a single etching step.

These are the circumstances which motivated the invention, although the results and objectives are in no way to be perceived as claim limitations unless such are specifically provided in the accompanying claims. The invention also has applicability outside of the problems from which it spawned, with the invention only being limited by the accompanying claims as literally worded without writing limitations or interpretations into the claims from the specification or drawings, and as appropriately interpreted in accordance with the doctrine of equivalents.

SUMMARY

The invention comprises chemical vapor deposition methods and methods of etching a contact opening over a node location on a semiconductor substrate. In but one implementation, a chemical vapor deposition method includes providing a semiconductor substrate within a chemical vapor deposition chamber. At least one liquid deposition precursor is vaporized with a vaporizer to form a flowing vaporized precursor stream. The flowing vaporized precursor stream is initially bypassed from entering the chamber for a first period of time while the substrate is in the deposition chamber. After the first period of time, the flowing vaporized precursor stream is directed to flow into the chamber with the substrate therein under conditions effective to chemical vapor deposit a layer over the substrate.

In one implementation, a method of etching a contact opening over a node location on a semiconductor substrate includes forming a dielectric first layer over a node location. An oxide second layer having plural dopants therein is formed over the dielectric first layer. The oxide second layer has an innermost portion and an outer portion. The outer portion has a higher concentration of one of the dopants than any concentration of the one dopant in the innermost portion. Using a single dry etching chemistry, a contact opening is etched into the outer and innermost portions of the oxide second layer to proximate the dielectric first layer over the node location. Etching is conducted into the dielectric first layer through the contact opening to proximate the node location.

In one implementation, a method of etching a contact opening over a node location on a semiconductor substrate includes forming a dielectric first layer over a node location. An oxide second layer having plural dopants therein is formed over the dielectric first layer. The oxide second layer has an innermost portion and an outer portion. The innermost portion has a higher concentration of one of the dopants than any concentration of the one dopant in the outer portion. Using a single dry etching chemistry, a contact opening is etched into the outer and innermost portions of the oxide second layer to proximate the dielectric first layer over the node location. Etching is conducted into the dielectric first layer through the contact opening to proximate the node location.

Other implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention comprises a chemical vapor deposition method. The invention also comprises a method of etching a contact opening over a node location on a semiconductor substrate. FIGS. 1–5 illustrate but one exemplary semiconductor substrate 10 for processing in accordance with aspects of the invention. Semiconductor substrate 10 comprises a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 comprises a pair of field effect transistor gate constructions 14 and 16 having a diffusion region 18 formed therebetween in semiconductive material of substrate 10/12. In this example, diffusion region 18 constitutes a node location to which electrical connection is ultimately desired. Various dielectric and conductive layers of constructions 14 and 16 are not specifically designated as not being particularly relevant to the invention. In the preferred embodiments, gate constructions 14 and 16 include outermost insulative dielectric regions whereby a substantially self aligned contact etch can be made through an overlying insulative layer to region 18 without exposing conductive material of the gates in the event of some mask misalignment. Exemplary materials are as described above where the overlying layer will be BPSG.

Figure 1:
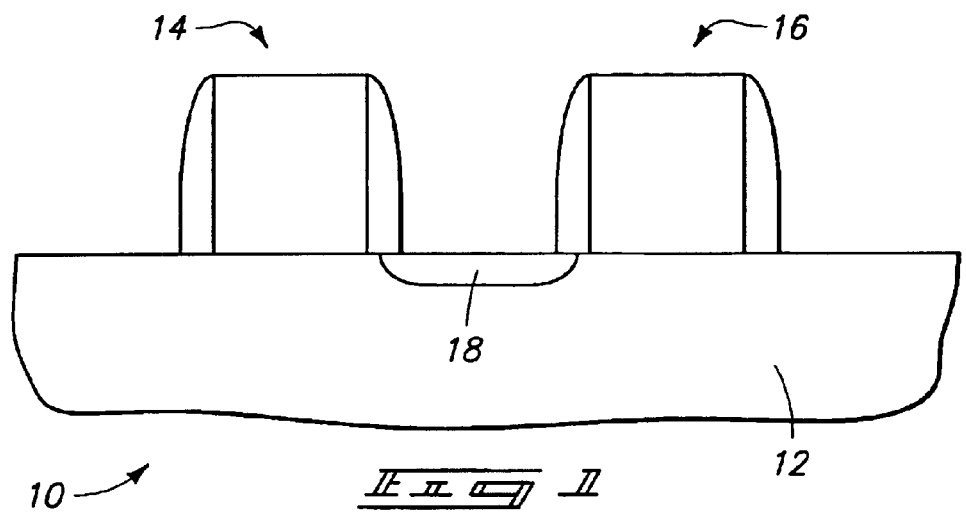
FIG. 1 is a diagrammatic sectional view of a semiconductor wafer fragment at one processing step in accordance with an aspect of the invention.
Figure 2:
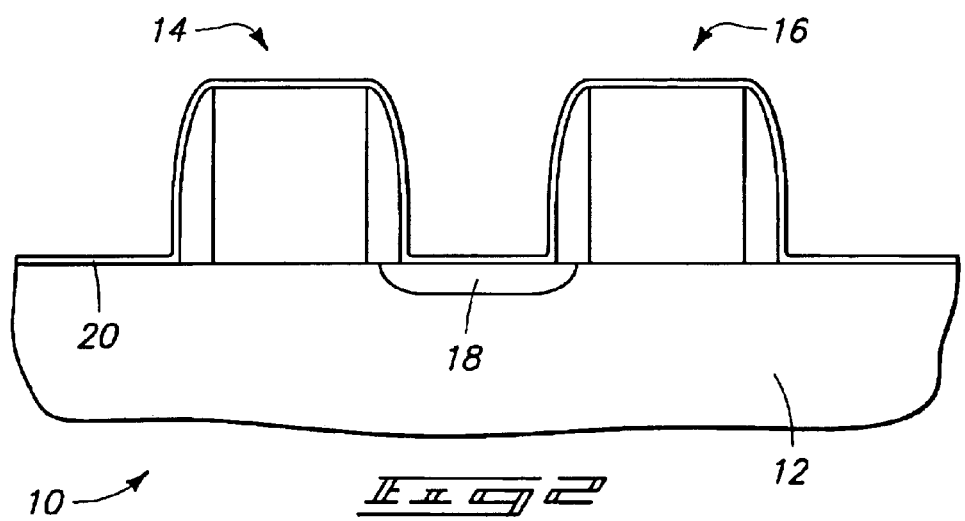
FIG. 2 is a view of the FIG. 1 wafer fragment at a processing step subsequent to that shown by FIG. 1.

Referring to FIG. 2, a dielectric first layer 20 is formed over node location 18. By way of example only, exemplary materials include silicon nitride, substantially undoped oxide, or combinations thereof. In the context of this document, "substantially undoped" means having essentially no measurable dopants therein, which in this specific example would mean essentially void of either boron or phosphorous. An exemplary preferred deposition thickness for dielectric layer 20 is from 50 Angstroms to 300 Angstroms. Such is preferably conventionally chemical vapor deposited in equipment which provides adequate conformality. Exemplary equipment includes an ASM A4000 Furnace, available from ASM International N.V. of The Netherlands.

Figure 3:
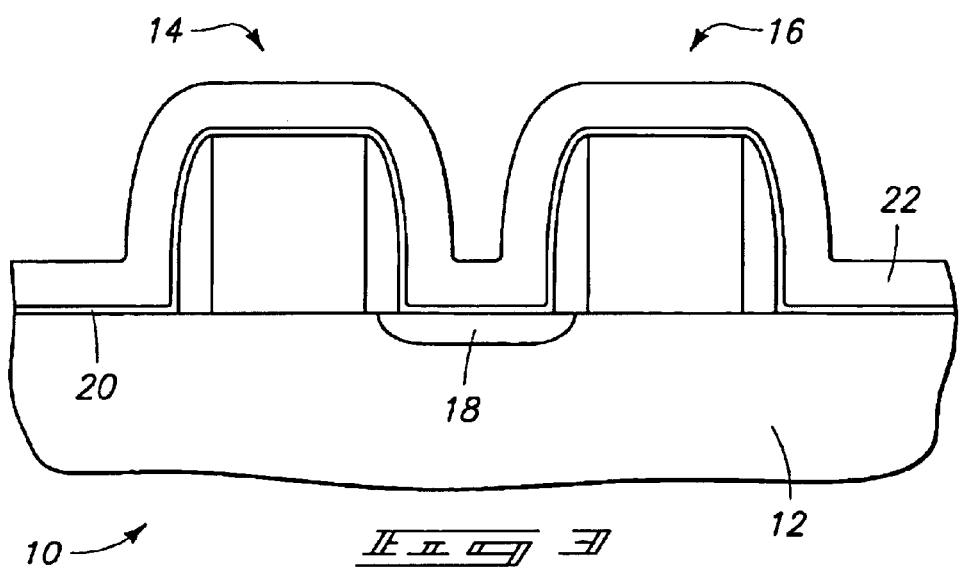
FIG. 3 is a view of the FIG. 1 wafer fragment at a processing step subsequent to that shown by FIG. 2.
Figure 7:
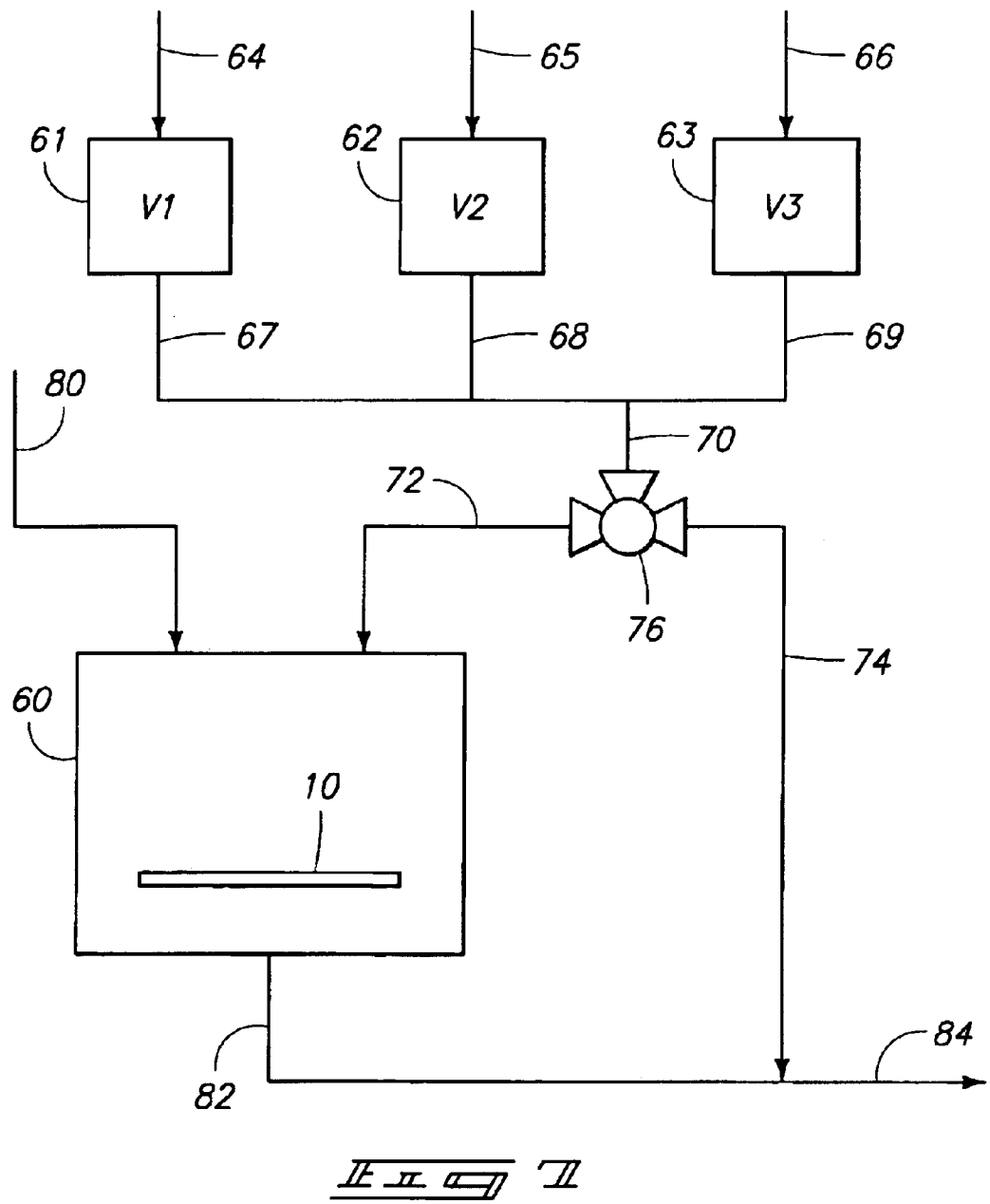
FIG. 7 is a diagrammatic schematic view of exemplary semiconductor wafer fabrication equipment usable in accordance with aspects of the invention.

Semiconductor substrate 10 is provided within a chemical vapor deposition chamber for formation of a first dielectric layer 22 (FIG. 3). FIG. 7 diagrammatically illustrates but one exemplary processing schematic usable for processing a semiconductor substrate in accordance with methodical aspects of the invention. Such comprises an exemplary chemical vapor deposition chamber 60 within which semiconductor substrate 10 would be received. FIG. 7 equipment comprises first, second and third liquid vaporizers 61, 62 and 63, which are also designated V1, V2 and V3, respectively. Such vaporizers might constitute any existing or yet-to-be developed vaporizers for liquid chemical vapor deposition precursors. Examples include bubblers, liquid flow controllers and other devices which result in vaporization of liquid material for flowing vapor to a chemical vapor deposition reactor. In the illustrated and preferred embodiment, chamber 60 is preferably a subatmospheric chemical vapor deposition reactor, and preferably not a plasma enhanced chemical vapor deposition reactor. The invention was reduced-to-practice using liquid flow controllers as the vaporizers and a Centura 5200 reactor available from Applied Materials of Santa Clara, Calif. Vaporizers 61, 62 and 63 include liquid precursor inlets 64, 65 and 66, respectively. Such vaporizers also include exiting vapor flowpaths 67, 68 and 69, respectively. Exiting streams 67, 68 and 69 join to form a combined flowpath 70. Flowpath 70 branches into a path 72 which is directed to chamber 60 and a path 74, which by-passes chamber 60. A control valve 76 is associated with lines 70, 72, and 74. Such controls the flow of vaporized precursors to the chamber and for bypassing the chamber. An additional exemplary vapor input line for chamber 60 is designated with numeral 80. An exit line 82 extends from chamber 60 and joins with bypass line 74, forming an exhaust line 84. Pressure, temperature and other control devices are not shown, as such are not particularly material to the invention disclosed herein.

The description proceeds with that of only an exemplary preferred embodiment of depositing a doped oxide layer over substrate 10. In this but one exemplary preferred embodiment, the outermost layer of the preferred dielectric mass being deposited will comprise borophosphosilicate glass. Thereby, feed stream 64 feeds a first liquid deposition precursor, for example tetraethylorthosilicate (TEOS). Line 65 feeds an exemplary second liquid deposition precursor of triethylphosphate. The phosphorous in such material constitutes an exemplary first dopant to at some point be provided in the dielectric mass being formed. Line 66 feeds an exemplary third liquid deposition precursor of triethylborate. The boron in such precursor constitutes an exemplary second precursor different from the first for provision at some point within the dielectric mass being fabricated. In this example, line 80 constitutes an exemplary input line for a fourth vapor precursor, here in this preferred embodiment to include one or a combination of $O_2$ and $O_3$.

In a specific and preferred embodiment, the liquid precursor flowing in stream 64 to vaporizer V1 is vaporized to form a flowing vaporized precursor within stream 67 and stream 70. Valve 76 is preferably initially totally closed to line 72 and is preferably initially totally opened to line 74. Thereby, the flowing vaporized precursor in stream 70 is initially bypassed from entering chamber 60 and allowed to flow out exhaust stream 84 for some first period of time while substrate 10 is within deposition chamber 60. A preferred reason for initially bypassing flow of the precursor to chamber 60 is that the flow of the flowing precursor from the vaporizer is typically not initially at a desired steady state. Preferably, the period of time is selected to be effective to achieve steady state flow of the vaporized precursor at the conclusion of the period. Accordingly, in the typical embodiment, flow of the vaporized precursor during the first period of time is not steady state during all of such first period.

In conjunction with the above flowing first vaporized precursor, the second liquid deposition precursor flowing in line 65 is preferably caused to be vaporized by vaporizer V2 to form a flowing second vaporized precursor, in this example comprising the phosphorous dopant, within line 68 and thereby also within combined flowpath 70 with the flowing first vaporized precursor from line 67. The flowing first and second vaporized precursors are thereby initially bypassed within combined flowpath 70 from entering chamber 60 for a period of time while substrate 10 is within deposition chamber 60. The preferred desire and effect is to achieve steady state flow at the desired deposition conditions of the first and second precursors within line 70 prior to flowing the same to deposition chamber 60. The period of time to achieve stabilization is typically less than 10 seconds. Preferably after achieving a steady state flow, the first and second vaporized precursors are directed within combined flowpath 70 to flow into chamber 60 with the substrate therein under conditions effective to chemical vapor deposit first dielectric layer 22 (FIG. 3) comprising the first dopant, in this example phosphorous, over substrate 10. Such can be accomplished by reversing the opened/closed relationship of lines 72/74 with valve 76.

Such conditions in the illustrated preferred example also include suitable flow of an oxygen/ozone mixture through line 80 into chamber 60. By way of example only, preferred flow rates from line 64 to vaporizer V1 include a TEOS flow at 600 mg/min and a flow within line 80 of 12% $O_3$/88% $O_2$ by weight at 3 standard liters/min. Such is considered in the context of a single wafer chamber 60 having a volume of approximately 6 liters. An exemplary pressure during deposition within chamber 60 is 200 Torr, with the wafer chuck temperature within chamber 60 preferably being maintained at about 530° C. An exemplary period of time to achieve steady state flow prior to directing the first vaporized precursor to the chamber is 10 seconds or less. A specific exemplary flow for triethylphosphate within line 65 is at 100 mg/min. A preferred result is to achieve approximately 4% to 12% phosphorous doping within layer 22. An exemplary preferred thickness for layer 22 is from about 50 Angstroms to about 500 Angstroms, with from about 100 Angstroms to about 300 Angstroms being preferred, and from about 200 Angstroms to 275 Angstroms being even more preferred.

At the conclusion of such processing, preferably any flow of ozone within line 80 is ceased, and a pure oxygen or inert gas caused to flow therethrough. Further preferably, valve 76 is preferably totally closed to line 72 and valve 76 is preferably totally opened to line 74, once again causing flowing vaporized precursor from lines 67 and 68 into line 70, into line 74 and out exhaust line 84.

In this embodiment, layer 22 is preferably as shown and described directly deposited on underlying dielectric layer 20. In this just described embodiment, no vaporized precursor flows from vaporizer V3 to chamber 60 during deposition of layer 22. Further, no other source of the second dopant is provided to chamber 60 in the depicted preferred example. Further, the concentration of the second dopant (in this example, boron) in first dielectric layer 22 is thereby substantially zero (meaning below detectable levels) at least at this point in the preferred embodiment process. Alternately, some third vaporized precursor might be caused to flow to chamber 60 during the first dielectric depositing, with the concentration of the second dopant in first dielectric layer 22 at this point in the process being at some desired measurable level. Typical prior art BPSG layers comprise from 2%–5% boron and from 4%–12% phosphorous, with the remainder constituting $SiO_2$ (by weight). In this particular example, where borophosphosilicate glass is being formed either in FIG. 3 or ultimately, the preferred concentration of boron within layer 22 is from 0%–4%. The preferred concentration of phosphorus within layer 22 is from 6% to 24%. Time for deposition of layer 22 will typically be from 2–4 seconds.

Preferably essentially simultaneously with the conclusion of layer 22 formation, the flowing first and second vaporized precursors within combined flowpath 70 are bypassed from entering chamber 60 while substrate 10 is therewithin. Such preferably occurs by switching valve 76 completely closed to line 72 and completely opened to line 74, all while continuing operation of vaporizers V1 and V2. Preferably essentially simultaneously therewith, a third deposition precursor, in this example in the form of triethylborate, flowing in line 66 is vaporized in vaporizer V3 forming a flowing third vaporized precursor comprising a second dopant (here, boron), different from the first dopant, in line 69. The flowing third vaporized precursor in line 69 is combined with the flowing bypassed first and second vaporized precursors in combined flowpath 70, with the combined flowing first, second and third vaporized precursors therewithin being bypassed to exhaust 84 and thereby prevented from entering chamber 60 for a period of time while substrate 10 is within chamber 60. As with the above-described processing, such period of time is preferably suitable to achieve steady state flow of the combined precursors, and will typically be less than 10 seconds. During the time where deposition does not occur within chamber 60, the flow of gasses from line 80 is preferably again changed to be pure $O_2$ or an inert gas. In the preferred described embodiment, flows are preferably as described above, with an exemplary flow of the triethylborate in line 66 being at 100 mg/min.

Preferably after the steady state has been achieved, the combined flowing first, second and third vaporized precursors within combined flowpath 70 are directed to flow into chamber 60 with substrate 10 therein under conditions effective to chemical vapor deposit a second dielectric layer 24 (FIG. 4) comprising the first and second dopants over first dielectric layer 22, and preferably directly thereon as shown. Second dielectric layer 24 preferably comprises a greater concentration of the second dopant (here boron) than any concentration of the second dopant in first dielectric layer 22. Further preferably, first dielectric layer 22 preferably comprises a greater concentration of the first dopant (here phosphorus) than any concentration of the first dopant in second dielectric layer 24. A preferred thickness for layer 24 is from 3,000 Angstroms to 15,000 Angstroms, with approximately 10,000 Angstroms being a specific preferred example. In the described example, an exemplary preferred concentration of boron and phosphorous within layer 24 is 3.8% and 7.6% by weight, respectively.

Figure 4:
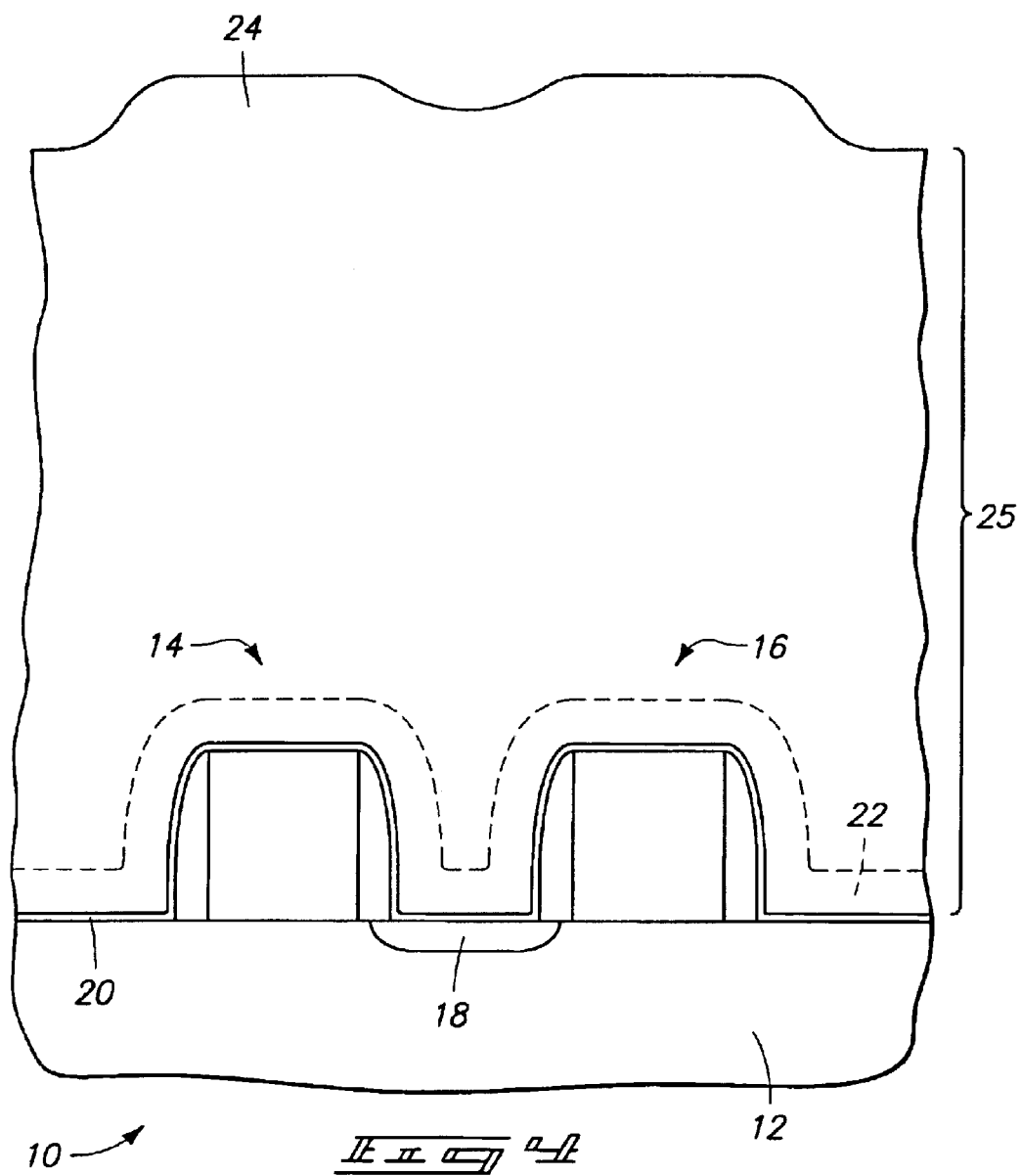
FIG. 4 is a view of the FIG. 1 wafer fragment at a processing step subsequent to that shown by FIG. 3.

The illustrated FIG. 4 construction can also be considered as constituting an oxide second layer 25 having plural dopants therein, and which is formed over a dielectric first layer 20. Oxide second layer 25 has an innermost portion 22 and an outer portion 24, with the outer portion having a higher concentration of one of the dopants than any concentration of the one dopant in innermost portion 22. Additional portions or layers with respect to oxide layer 25 might also be provided. Further as outlined above, innermost portion 22 might be fabricated to contain no measurable quantity of the one dopant (here, boron), which is preferred, or alternately be formed to contain some measurable quantity of the one dopant, which is not as preferred. Further, innermost portion 22 might also be fabricated to contain no measurable quantity of any dopant.

The FIG. 4 construction can also be considered as innermost portion 22 having a higher concentration of one of the dopants than any concentration of the one dopant in outer portion 24. Further, outer portion 24 might be fabricated to contain no measurable quantity of the one dopant (here, phosphorus) or alternately and preferred be formed to contain some measurable quantity of the one dopant.

Figure 5:
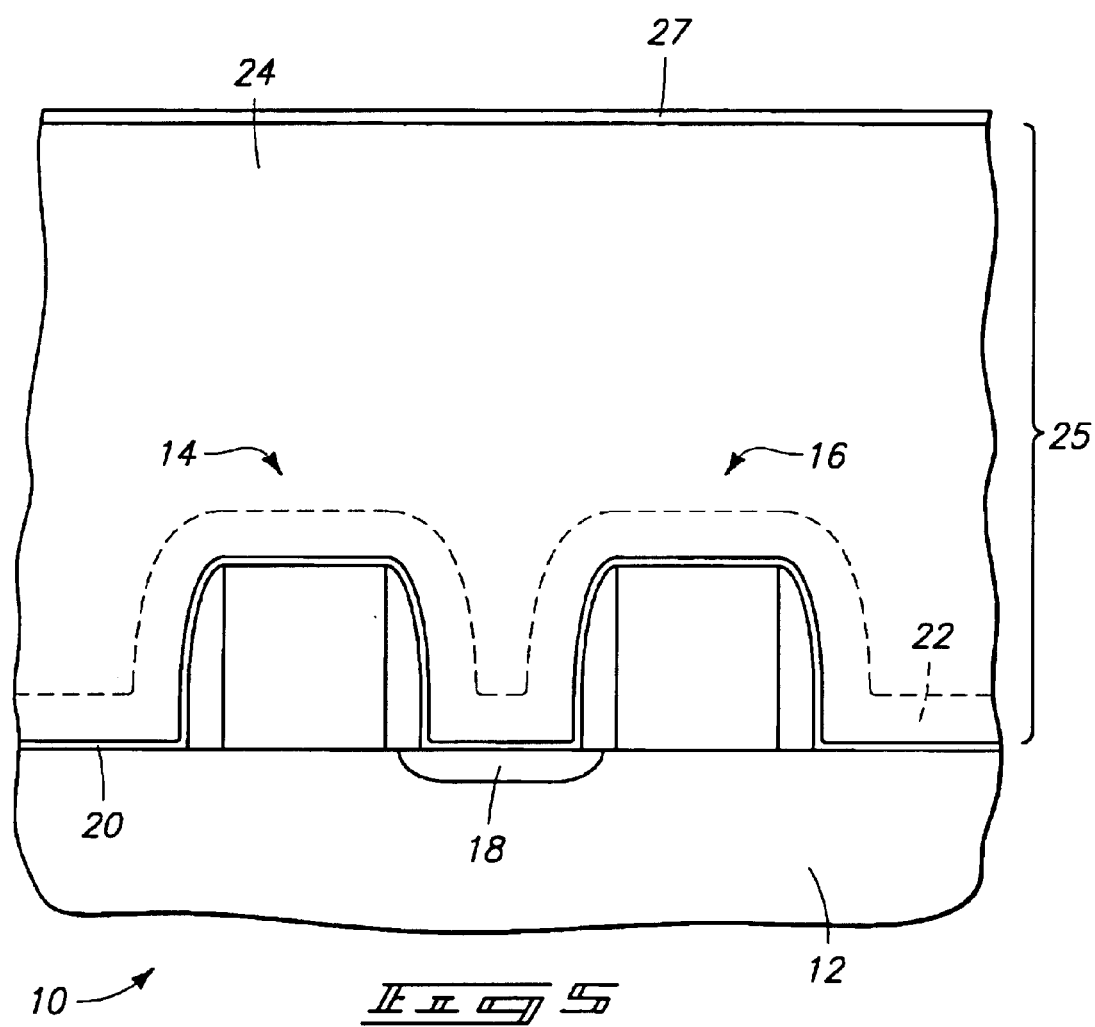
FIG. 5 is a view of the FIG. 1 wafer fragment at a processing step subsequent to that shown by FIG. 4.

Referring to FIG. 5, substrate 10 has been removed from chamber 60, has been planarized, and an antireflective coating 27 has been deposited. An exemplary material for layer 27 is a 400 Angstrom thick silicon rich oxynitride film, for example 54% silicon, 36% oxygen and 10% nitrogen.

Figure 6:
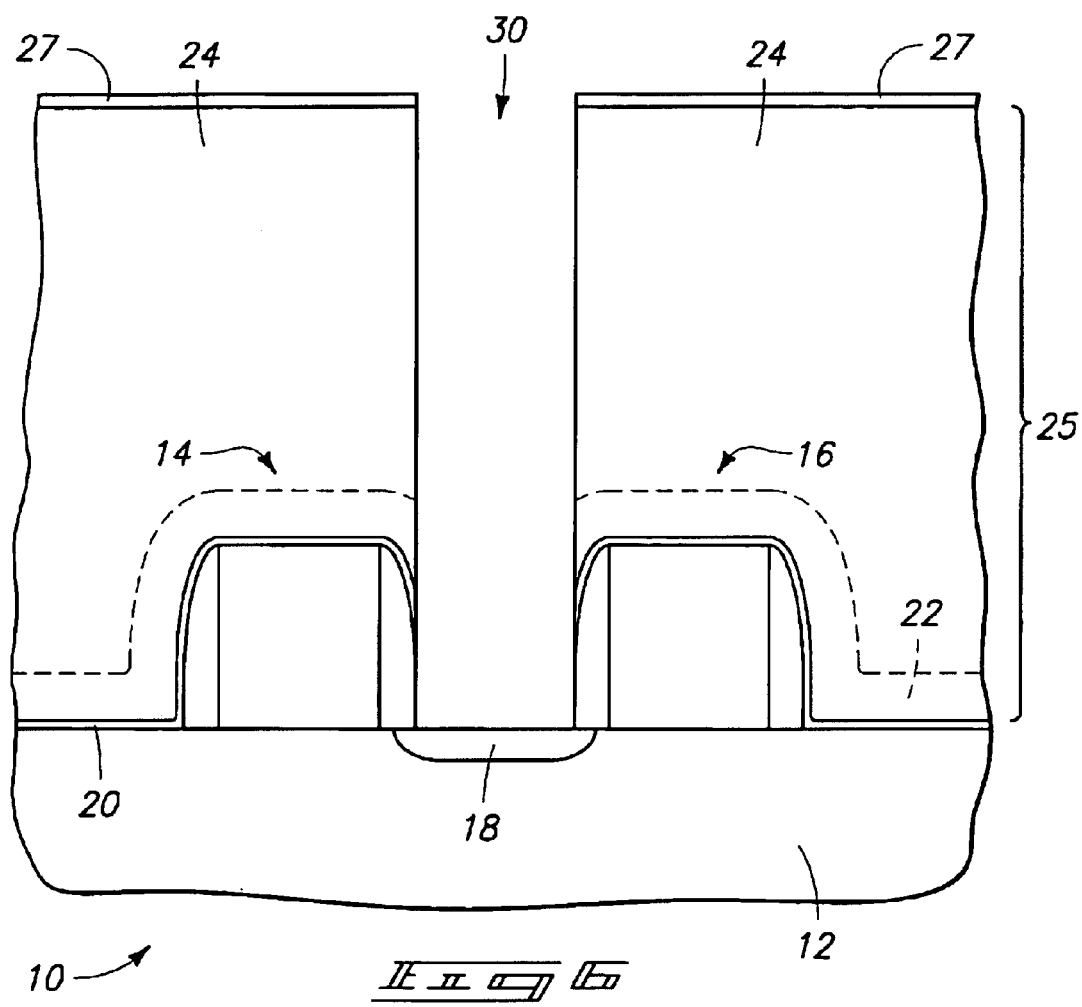
FIG. 6 is a view of the FIG. 1 wafer fragment at a processing step subsequent to that shown by FIG. 5.

Referring to FIG. 6, masking has preferably been conducted over layers 25 and 27, preferably using photolithography and photoresist. An opening is then etched through layer 27 to expose layer 25. An exemplary etch chemistry for the above silicon rich oxynitride coating is 80 sccm $CF_4$, 160 sccm Ar, and 20 sccm $O_2$ at 40 mTorr and 1400 Watts. Such is typically fairly non-selective, and preferably also acts as a descum to remove any residual photoresist at the base of the contact hole therein (not shown). Then using a single dry etching chemistry, a contact opening 30 is etched into outer portion 24 and innermost portion 22 to proximate dielectric layer 20 over node location 18. Reduction of boron content within the innermost portion of a BPSG layer, particularly when etching high aspect ratios of at least 4.0 through layer 25, has been determined to facilitate achieving adequate removal in etching the exemplary contact opening, preferably at least all the way to dielectric layer 20, and depending on the composition of layer 20 all the way to region 18. Further, increase in phosphorus content within the innermost portion of a BPSG layer, particularly when etching high aspect ratios, has been determined to facilitate achieving adequate removal in etching the exemplary contact opening. Preferred is a combination of more phosphorus in the innermost portion as compared to the outer portion, and less boron in the innermost portion as compared to the outer portion. An exemplary preferred chemistry is the $CHF_3$, $CF_4$, $CH_2F_2$ and Ar chemistry described above in a magnetically enhanced reactive ion plasma reactor.

When layer 20 comprises nitride or some other material which is not sufficiently etched by the single etching chemistry for layer 25, layer 20 can be suitably dry or wet etched to effectively outwardly expose node location 18.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of etching a contact opening over a node location on a semiconductor substrate, comprising:
    forming a dielectric first layer over a node location;
    forming an oxide second layer having plural dopants therein over the dielectric first layer, the oxide second layer having an innermost portion and an outer portion, the outer portion having a higher concentration of one of the dopants than any concentration of the one dopant in the innermost portion;
    using a single dry etching chemistry, etching a contact opening into the outer and innermost portions of the oxide second layer to proximate the dielectric first layer over the node location; and
    etching into the dielectric first layer through the contact opening to proximate the node location.

2. The method of claim 1 wherein the dielectric first layer comprises a substantially undoped oxide.

3. The method of claim 1 wherein the dielectric first layer comprises a substantially undoped oxide, and the oxide second layer is formed on the dielectric first layer.

4. The method of claim 1 wherein the dielectric first layer comprises a nitride.

5. The method of claim 1 wherein the oxide second layer is formed on the dielectric first layer, the dielectric first layer comprises a substantially undoped oxide, and the etching into the dielectric first layer through the contact opening to proximate the node location comprises continuing the etching with the single dry etching chemistry at least until the node location is outwardly exposed.

6. The method of claim 1 wherein the etching the dielectric first layer to proximate the node location comprises a dry etch chemistry the same as the single dry etching chemistry.

7. The method of claim 1 further comprising forming a third dielectric layer over the oxide second layer, and etching the third dielectric layer using a chemistry different from the single dry etching chemistry prior to etching said contact opening.

8. The method of claim 1 wherein the node location is formed between a pair of field effect transistor gate lines.

9. The method of claim 1 wherein the node location comprises a diffusion region formed in semiconductive material received between a pair of field effect transistor gate lines.

10. The method of claim 1 comprising forming the innermost portion to contain some measurable quantity of the one dopant.

11. The method of claim 1 comprising forming the innermost portion to contain no measurable quantity of the one dopant.

12. The method of claim 1 comprising forming the innermost portion to a thickness of from about 50 Angstroms to about 500 Angstroms.

13. The method of claim 1 comprising forming the innermost portion to a thickness of from about 100 Angstroms to about 300 Angstroms.

14. The method of claim 1 comprising forming the contact opening in the oxide second layer to have an aspect ratio of at least 4.0.

15. A method of etching a contact opening over a node location on a semiconductor substrate, comprising:

forming a dielectric first layer over a node location;

forming an oxide second layer having plural dopants therein over the dielectric first layer, the oxide second layer having an innermost portion and an outer portion, the innermost portion having a higher concentration of one of the dopants than any concentration of the one dopant in the outer portion;

using a single dry etching chemistry, etching a contact opening into the outer and innermost portions of the oxide second layer to proximate the dielectric first layer over the node location; and etching into the dielectric first layer through the contact opening to proximate the node location.

16. The method of claim 15 comprising forming the oxide second layer on the dielectric first layer.

17. The method of claim 15 comprising forming the outer portion to contain some measurable quantity of the one dopant.

18. The method of claim 15 comprising forming the outer portion to contain no measurable quantity of the one dopant.

19. The method of claim 15 comprising forming the innermost portion to a thickness of from about 100 Angstroms to about 300 Angstroms.

20. A method of etching a contact opening over a node location on a semiconductor substrate, comprising:

forming a dielectric layer over a node location, the node location comprising a diffusion region formed in semiconductive material received between a pair of field effect transistor gate lines;

forming a boron and phosphorus doped oxide layer on the dielectric layer, the doped oxide layer having an innermost portion and an outer portion, the outer portion having a higher concentration of boron than any concentration of boron in the innermost portion;

using a single dry etching chemistry, etching a contact opening into the outer and innermost portions of the oxide layer to proximate the dielectric layer over the node location; and etching into the dielectric layer through the contact opening to outwardly expose the node location.

21. The method of claim 20 comprising forming the innermost portion to contain some measurable quantity of boron.

22. The method of claim 20 comprising forming the innermost portion to contain no measurable quantity of boron.

23. A method of etching a contact opening over a node location on a semiconductor substrate, comprising:

forming a dielectric layer over a node location, the node location comprising a diffusion region formed in semiconductive material received between a pair of field effect transistor gate lines;

forming a boron and phosphorus doped oxide layer on the dielectric layer, the doped oxide layer having an innermost portion and an outer portion, the innermost portion having a higher concentration of phosphorus than any concentration of phosphorus in the outer portion;

using a single dry etching chemistry, etching a contact opening into the outer and innermost portions of the oxide layer to proximate the dielectric layer over the node location; and etching into the dielectric layer through the contact opening to outwardly expose the node location.

24. The method of claim 23 comprising forming the outer portion to contain some measurable quantity of phosphorus.

25. The method of claim 23 comprising forming the outer portion to contain no measurable quantity of phosphorus.

26. A method of etching a contact opening over a node location on a semiconductor substrate, comprising:

forming a dielectric layer over a node location, the node location comprising a diffusion region formed in semiconductive material received between a pair of field effect transistor gate lines;

forming a boron and phosphorus doped oxide layer on the dielectric layer, the doped oxide layer having an innermost portion and an outer portion, the outer portion having a higher concentration of boron than a concentration of boron in the innermost portion, the innermost portion having a higher concentration of phosphorus than a concentration of phosphorus in the outer portion;

using a single dry etching chemistry, etching a contact opening through the outer and innermost portions over the node location; and etching into the dielectric layer through the contact opening to outwardly expose the node location.

27. The method of claim 26 wherein the dielectric layer comprises a substantially undoped oxide.

28. The method of claim 26 wherein the dielectric layer comprises a nitride.

29. The method of claim 26 wherein the etching into the dielectric layer through the contact opening to proximate the node location comprises continuing the etching with the single dry etching chemistry at least until the node location is outwardly exposed.

30. The method of claim 26 comprising forming the innermost portion to a thickness of from about 50 Angstroms to about 500 Angstroms.

31. The method of claim 26 comprising forming the innermost portion to a thickness of from about 100 Angstroms to about 300 Angstroms.

32. The method of claim 26 comprising forming the contact opening in the oxide second layer to have an aspect ratio of at least 4.0.

* * * * *

UNITED STATES PATENT AND TRADEMARK OFFICE
CERTIFICATE OF CORRECTION

PATENT NO. : 6,982,228 B2  Page 1 of 1
APPLICATION NO. : 10/278530
DATED : October 22, 2002
INVENTOR(S) : Mark E. Jost et al.

It is certified that error appears in the above-identified patent and that said Letters Patent is hereby corrected as shown below:

Col. 1, line 17 —
  Replace "The invention primarily grew out needs for making highly"
  With --The invention primarily grew out of needs for making highly--

Signed and Sealed this

First Day of August, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,982,228 B2 |
| APPLICATION NO. | : 10/278530 |
| DATED | : January 3, 2006 |
| INVENTOR(S) | : Mark E. Jost et al. |

It is certified that error appears in the above-identified patent and that said Letters Patent is hereby corrected as shown below:

Col. 1, line 17 —
  Replace "The invention primarily grew out needs for making highly"
  With --The invention primarily grew out of needs for making highly--

This certificate supersedes Certificate of Correction issued August 1, 2006.

Signed and Sealed this

Twelfth Day of September, 2006

JON W. DUDAS
*Director of the United States Patent and Trademark Office*